(12) United States Patent
Schiavone et al.

(10) Patent No.: US 6,528,341 B1
(45) Date of Patent: Mar. 4, 2003

(54) METHOD OF FORMING A SION ANTIREFLECTION FILM WHICH IS NONCONTAMINATING WITH RESPECT TO DEEP-UV PHOTORESISTS

(75) Inventors: Patrick Schiavone, Villard-Bonnot (FR); Frédéric Gaillard, Voiron (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/806,808

(22) PCT Filed: Oct. 1, 1999

(86) PCT No.: PCT/FR99/02337

§ 371 (c)(1),
(2), (4) Date: Jul. 18, 2001

(87) PCT Pub. No.: WO00/21123

PCT Pub. Date: Apr. 13, 2000

(30) Foreign Application Priority Data

Oct. 1, 1998 (FR) .............................. 98 12310

(51) Int. Cl.[7] .............................................. H01L 21/00
(52) U.S. Cl. ......................................... 438/72; 438/954
(58) Field of Search ............................ 438/68, 72, 113, 438/770, 787, 954, 680, 769, 775

(56) References Cited

U.S. PATENT DOCUMENTS 5,710,067 A * 1/1998 Foote et al. ................. 257/632
6,004,850 A * 12/1999 Lucas et al. ................. 438/301
6,013,582 A * 1/2000 Ionov et al. ................. 438/738
6,326,231 B1 * 12/2001 Subramanian et al. ......... 438/72

* cited by examiner

Primary Examiner—David Nelms
Assistant Examiner—David Nhu
(74) Attorney, Agent, or Firm—Meyertons, Hood, Kivlin, Kowert & Goetzel, P.C.; Eric B. Meyertons

(57) ABSTRACT

A method of forming a silicon oxynitride antireflection film which is noncontaminating with respect to deep-ultraviolet photoresists (DUV photoresists) on each of a series of silicon semiconductor substrates successively introduced into the same reactor chamber includes a step of plasma-enhanced chemical vapor deposition (PECVD) of a silicon oxynitride antireflection film and treatment of the antireflection film with an oxygen plasma. The reactor chamber is cleaned before the successive introduction of each of the substrates by purging the reactor chamber using an oxygen-free gas plasma and then depositing a silicon oxynitride blanket by plasma-enhanced chemical vapor deposition using precursor gases.

11 Claims, 1 Drawing Sheet

METHOD OF FORMING A SION ANTIREFLECTION FILM WHICH IS NONCONTAMINATING WITH RESPECT TO DEEP-UV PHOTORESISTS

BACKGROUND OF THE INVENTION

1. Field of the Invention

The present invention relates in general to a method of forming an antireflection film of silicon oxynitride (SiON) on a surface of a semiconductor substrate and more particularly to an SiON antireflection film which is noncontaminating with respect to photoresists and more specifically deep-ultraviolet or chemical-amplification photoresists used during the process of fabricating semiconductor devices such as integrated circuits.

2. Description of the Related Art

The continual trend in the semiconductor industry toward fabricating integrated circuits with ever-decreasing geometry has led to an increase in problems associated with the formation of the photoresist masks for photolithographically etching the circuits.

Spurious reflections due to the underlying materials cause distortion of the resulting photoresist patterns.

This problem is exacerbated in the case of technologies smaller than 0.25 μm in which deep-UV radiation (wavelengths of 248 nm or less) and deep-UV or chemical-amplification photoresists (DUV photoresists) are used for the photolithographic etching.

To remedy this problem of spurious reflections, an antireflection film is disposed between the surface of the substrate to be photolithographically etched and the layer of photoresist.

Various materials, such as $Si_3N_4$ and silicon oxynitride, have been proposed for making the antireflection films.

Unfortunately, when carrying out deep-UV photolithography using a deep-UV or chemical-amplification photoresist on an antireflection film, for example made of silicon oxynitride, a "stub" appears the interface between the photoresist and the silicon oxynitride film due to interaction between the photoresist and the nitrogen contained in the film. The appearance of this "stub" impairs the subsequent etching step and control of the dimensions of the etched feature.

To help overcome this drawback, it has been proposed to form a thin silicon oxide layer on the silicon oxynitride antireflection film using an oxygen plasma.

The silicon oxide layer must be as thin a possible so that the optical properties of the antireflection film are not degraded and the film can be easily removed during subsequent photolithographic etching steps.

Moreover, creating the oxygen plasma in situ (i.e. in the same reactor chamber as that in which the SiON antireflection film was deposited) results in the formation of particles on the substrates subsequently introduced into the reactor chamber. This contamination of the substrates impairs the quality of the semiconductor devices produced.

The present invention therefore provides a method of forming a silicon oxynitride antireflection film on a semiconductor substrate, which film is noncontaminating with respect to photoresists, in particular for deep-UV photolithographic etching, and avoids the contamination of silicon oxynitride antireflection coatings deposited on substrates successively introduced into the same reactor.

BRIEF DESCRIPTION OF THE DRAWINGS

Advantages of the present invention may become apparent to those skilled in the art with the benefit of the following detailed description of the preferred embodiments and upon reference to the accompanying drawings in which.

SUMMARY OF THE INVENTION

Figure 1:
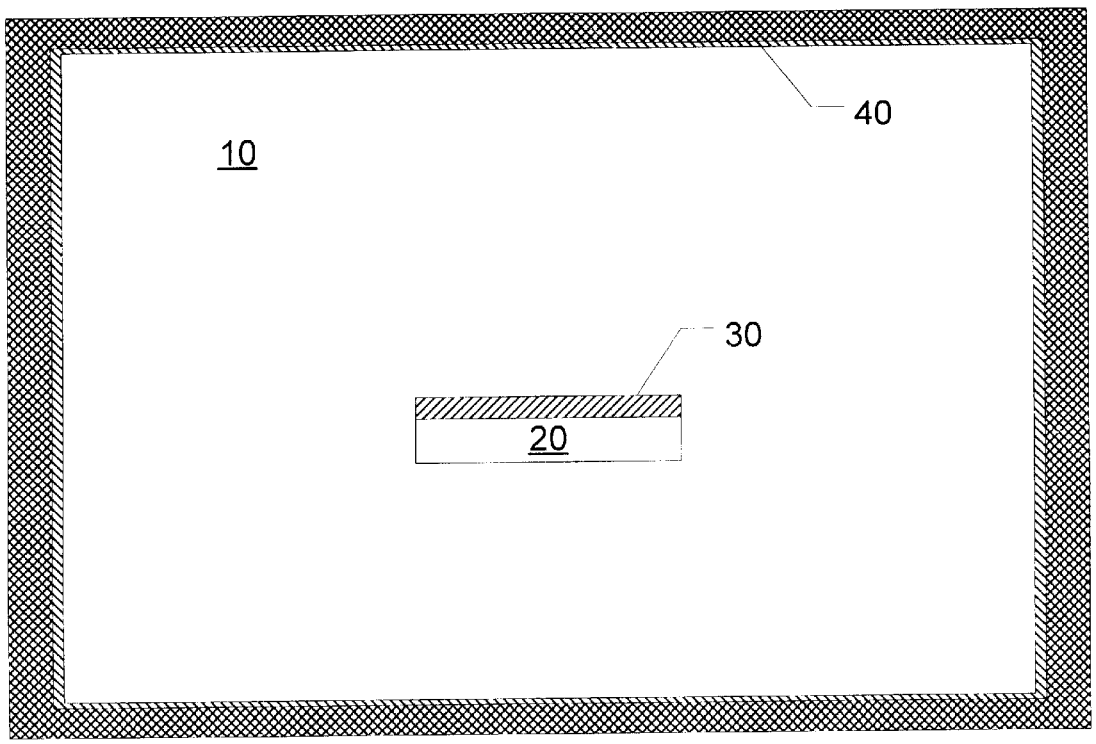
FIG. 1 depicts a representation of an embodiment of a reactor chamber with a substrate.

The invention provides a method of forming a silicon oxynitride antireflection film, which is noncontaminating with respect to deep-UV photoresists on each of a series of silicon semiconductor substrates successively introduced into the same reactor chamber. The method includes a plasma-enhanced chemical vapor deposition of a silicon oxynitride antireflection film, treatment of the antireflection film with an oxygen plasma, and cleaning of the reactor chamber before the successive introduction of each of the substrates by:

a) purging the reactor chamber using an oxygen-free gas plasma; and then b) depositing a silicon oxynitride blanket by plasma-enhanced chemical vapor deposition using precursor gases.

In step (a), for purging by means of an oxygen-free gas plasma, the gas used is a fluorinated gas such as $CF_4$, $C_2F_6$, $NF_3$ or $SF_6$, preferably $CF_4$. The conditions under which the plasma is created are conventional.

The duration of purging step (a) is generally from 10 to 60 seconds.

The purging step is essential as it enables practically all residual oxygen in the chamber following the treatment of a previous substrate to be consumed.

In step (b), the silicon oxynitride blanket deposition is carried out under the same conditions as the conventional deposition of the SiON antireflection film.

Thus, in order to carry out the deposition of the SiON blanket using PECVD, it is possible to use $N_2O$ and $SiH_4$ with appropriate flowrates as precursor gases, and a high-frequency generator operating at 380 kHz, for example.

The duration of blanket deposition is in general about 1 to 60 seconds.

The blanket deposition step makes it possible to fix the particles remaining in the reactor chamber to the walls of the chamber.

The deposition of the SiON antireflection film takes place under the same conditions and its duration is determined to obtain a layer with the desired thickness, in general about 15 to 30 nm.

The oxygen plasma treatment is conventional.

It is possible to use the same RF generator to create the oxygen plasma. The duration of the treatment may vary from a few seconds to 1 minute or more, but in general it is from 10 to 60 seconds, and depends on the power of the RF generator.

Thus, an oxygen flowrate of 1 000 standard $cm^3$/minute, an RF power of 500 W to 1 000 W and a treatment duration of 10 to 60 seconds can be used to modify the SiON film over a depth of 3 to 4 nm.

The effect of the oxygen plasma on an SiON film was measured using a spectroscopic ellipsometer and by measuring the etching rate in hydrofluoric/orthophosphoric acid baths. These measurements confirmed the presence of a silicon oxide layer a few nanometers thick. The Silicon oxide layer is sufficient to prevent interaction between the nitrogen of the SiON antireflection film and the DUV photoresist.

FIG. 1 depicts a representation of an embodiment of reactor chamber 10. One or more substrates 20 may be successively introduced into reactor chamber 10. Reactor chamber 10 may be cleaned before introduction of substrate 20. Reactor chamber 10 may be cleaned by purging the reactor chamber with an oxygen-free gas plasma and then depositing silicon oxynitride blanket 40 by plasma-enhanced chemical vapor deposition. Silicon oxynitride antireflection film 30 may be deposited on substrate 20 by plasma-enhanced chemical vapor deposition. Silicon oxynitride antireflection film 30 may be treated with an oxygen plasma.

Once the SiON antireflection film has been deposited according to an embodiment of the proposed method, the rest of the process for fabricating the semiconductor device is carried out conventionally.

However, it is preferable to remove the SiON film before the step of depositing the spacers, since before this step a conventional gate reoxidation step is generally carried out and would convert the SiON film into an $SiO_xN_Y$ film, which is not easily removable.

By way of example, the oxygen-plasma-treated SiON film may be removed by successively dipping into a dilute HF solution (for about 30 seconds) and into an $H_3PO_4$ solution (for about 2 minutes).

This removal is selective with respect to the gate oxide and is integrated with respect to the active zone.

The device can then be cleaned conventionally using an SC1 solution ($H_2O_2$/$NH_4OH$), rinsing with deionized water and drying before reoxidizing the gate (which takes about 10 minutes) and depositing the spacers.

There is claimed:

1. A method of forming a silicon oxynitride antireflection film which is noncontaminating with respect to deep-ultraviolet photoresists on each of a series of silicon semiconductor substrates successively introduced into a reactor chamber, the method comprising depositing, by plasma-enhanced chemical vapor deposition, a silicon oxynitride antireflection film and treating said antireflection film with an oxygen plasma, wherein said reactor chamber is cleaned before the successive introduction of each of said substrates by:

purging said reactor chamber using an oxygen-free gas plasma; and depositing a silicon oxynitride blanket by plasma-enhanced chemical vapor deposition using precursor gases.

2. The method claimed in claim 1, wherein said oxygen-free gas plasma is a fluorinated gas plasma.

3. The method claimed in claim 2, wherein said fluorinated gas comprises $CF_4$, $C_2F_6$, $NF_3$ or $SF_6$.

4. The method claimed in claim 1, wherein purging said reactor chamber lasts from 10 to 60 seconds.

5. The method claimed in claim 1, wherein said precursor gases comprise $N_2O$ and $SiH_4$.

6. The method claimed in claim 1, wherein depositing a silicon oxynitride blanket lasts from 1 to 60 seconds.

7. The method claimed in claim 1, wherein purging said reactor consumes all residual oxygen in the chamber.

8. The method claimed in claim 1, wherein the plasma-enhanced chemical vapor deposition of a silicon oxynitride antireflection film takes place under the same process conditions as depositing a silicon oxynitride blanket.

9. The method claimed in claim 1, wherein the plasma-enhanced chemical vapor deposition of a silicon oxynitride antireflection film takes place under substantially similar process conditions as depositing a silicon oxynitride blanket.

10. The method claimed in claim 1, wherein the silicon oxide layer formed from said treatment of said antireflection film with an oxygen plasma inhibits interaction between the nitrogen of the silicon oxynitride antireflection film and the deep-ultraviolet photoresists.

11. The method claimed in claim 1, wherein a silicon oxide layer formed from said treatment of said antireflection film with an oxygen plasma inhibits interaction between nitrogen in the silicon oxynitride antireflection film and the deep-ultraviolet photoresists.

* * * * *